United States Patent
Murai

(10) Patent No.: US 7,083,269 B2
(45) Date of Patent: Aug. 1, 2006

(54) PIEZOELECTRIC ELEMENT, LIQUID JETTING HEAD, AND METHOD FOR MANUFACTURING THEREOF

(75) Inventor: Masami Murai, Nagano (JP)

(73) Assignee: Seiko Epson Corporation, Tokyo (JP)

(*) Notice: Subject to any disclaimer, the term of this patent is extended or adjusted under 35 U.S.C. 154(b) by 23 days.

(21) Appl. No.: 10/353,055

(22) Filed: Jan. 29, 2003

(65) Prior Publication Data

US 2004/0001120 A1    Jan. 1, 2004

(30) Foreign Application Priority Data

Jan. 29, 2002 (JP) ............................. 2002-020660
Jan. 9, 2003 (JP) ............................. 2003-003152

(51) Int. Cl.
B41J 2/045 (2006.01)

(52) U.S. Cl. .................. 347/68; 347/70; 347/71

(58) Field of Classification Search ............... 29/25.35; 347/68, 70, 71; 252/62.59, 62.9; 427/100; 438/3, 21

See application file for complete search history.

(56) References Cited

U.S. PATENT DOCUMENTS

| 5,656,382 A | 8/1997 | Nashimoto ................ 428/620 |
| 6,066,581 A | 5/2000 | Chivukula et al. ............ 501/12 |
| 6,447,838 B1 * | 9/2002 | Azuma et al. ................ 427/80 |

FOREIGN PATENT DOCUMENTS

| EP | 0 993 953 A2 | 4/2000 |
| EP | 1 137 078 A2 | 9/2001 |
| JP | 8-335676 | 12/1996 |
| JP | 10-81016 | 3/1998 |
| JP | 2000-103693 | 4/2000 |
| JP | 2001-274472 A | 10/2001 |

OTHER PUBLICATIONS

Copy of European Search Report for European Application No. 03002067.7, mailed Oct. 20, 2005, European Patent Office, Munich, Germany.

* cited by examiner

Primary Examiner—Hai Pham
Assistant Examiner—Lam S. Nguyen
(74) Attorney, Agent, or Firm—Sterne, Kessler, Goldstein & Fox P.L.L.C.

(57) ABSTRACT

The present invention provides a piezoelectric element having consistently high piezoelectric characteristics, and a liquid jetting head in which this element is used. A bottom electrode 42 (which contains Ir), a Ti layer of no less than 4 nm and no more than 6 nm, a piezoelectric thin film 43, and a top electrode 44 are sequentially layered on a $ZrO_2$ film 32. The piezoelectric thin film 43 has the degree of orientation in the 100 plane, as measured by the X-ray diffraction wide angle technique, is 70% or greater, the degree of orientation in the 110 plane is 10% or less, and the degree of orientation in the 111 plane constitutes the remaining balance. Such piezoelectric thin film 43 can be obtained stably with good reproducibility by keeping the humidity of the environment for forming the piezoelectric thin film at 30% Rh or less.

8 Claims, 7 Drawing Sheets

1: INK-JET RECORDING HEAD

PIEZOELECTRIC ELEMENT, LIQUID JETTING HEAD, AND METHOD FOR MANUFACTURING THEREOF

BACKGROUND OF THE INVENTION

1. Field of the Invention

The present invention relates to a piezoelectric element having electromechanical conversion functionality, and more particularly to a piezoelectric element that has excellent piezoelectric characteristics when used in an inkjet recording head or other liquid jetting head, to a liquid jetting head using this, and to a piezoelectric element manufacturing method.

2. Description of the Related Art

Inkjet recording heads use piezoelectric elements as drive sources for jetting the ink in printers. Such piezoelectric elements commonly comprise piezoelectric thin films and top and bottom electrodes disposed on both sides thereof.

Piezoelectric elements with improved characteristics have been developed by designing a thin-film crystal structure that comprises lead zirconate titanate (PZT), and forming a Ti nucleus on the bottom electrode. For example, a PZT thin film that has a rhombohedral crystal structure and a specific degree of orientation is disclosed in Japanese Patent Publication No. H10-81016. Further, a piezoelectric element in which a Ti nucleus is formed on an Ir bottom electrode is disclosed in Japanese Patent Publication No. H8-335676.

In conventional steps for manufacturing piezoelectric elements, however, problems are encountered such that the desired degree of orientation of crystal planes in a piezoelectric thin film is difficult to obtain in a stable manner. With such piezoelectric elements, high piezoelectric characteristics are difficult to obtain in a stable manner as a result of the fact that the degree of orientation of the crystal plane is unstable. This is a factor that makes it difficult to achieve an adequate printing performance in an inkjet recording head or printer.

SUMMARY OF THE INVENTION

An object of the present invention is to provide a piezoelectric element in which the aforementioned drawbacks are overcome and consistently high piezoelectric characteristics achieved by controlling the humidity of the steps for forming a piezoelectric thin film, and thereby stabilizing and obtaining with good reproducibility the degree of orientation of the piezoelectric thin film; to provide a liquid jetting head in which this element is used, and to provide a piezoelectric element manufacturing method.

The piezoelectric element of the present invention comprises a bottom electrode formed on a $ZrO_2$ film, a piezoelectric thin film formed on the bottom electrode, and a top electrode formed on the piezoelectric thin film; wherein a piezoelectric thin film whose degree of orientation in the 100 plane, as measured by the X-ray diffraction wide angle technique, is 70% or greater can be consistently obtained by keeping the humidity during film forming within a range of 30% Rh or less.

The term "humidity" refers to relative humidity at room temperature (25° C.), which, in a narrow sense, depends on the content of moisture in the atmosphere, or absolute humidity.

The degree of orientation in each of the planes 100, 110, and 111 is indicated in terms of a proportion at which the sum of the diffracted intensities measured by the X-ray diffraction wide angle technique is equal to 100%.

The degrees of orientation in planes other than the 100 plane of the piezoelectric thin film is preferably such that the degree of orientation in the 110 plane is 10% or less, and the degree of orientation in the 111 plane constitutes the remaining balance.

The bottom electrode preferably comprises Ir/Pt/Ir, Ir/Pt, Pt/Ir, or another arrangement containing at least an Ir layer.

The thickness of the Ti nucleus formed on the bottom electrode should be 3–7 nm, and preferably 4–6 nm.

Another aspect of the present invention is that after the formation of the bottom electrode but before the formation of the Ti nucleus, the desired area of the bottom electrode film formed on a substrate is removed from above the $ZrO_2$ film by the patterning of the bottom electrode, the Ti nucleus is then grown on the bottom electrode, and a piezoelectric thin film is further formed by a sol-gel technique on the Ti nucleus. The degree of orientation of the piezoelectric thin film in the 100 plane can thus be controlled in a stable manner.

The piezoelectric element manufacturing system of the present invention comprises a manufacturing apparatus capable of performing a step for forming a piezoelectric thin film on a bottom electrode, and a humidity-adjusting apparatus for adjusting the environment for forming the piezoelectric thin film to a humidity of 30% Rh or less.

As used herein, the term "degree of orientation in the 100 plane" refers to the ratio of I(100) to the sum of I(100), I(110), and I(111), where I(XYZ) is the diffracted intensities of peaks (2θ) that correspond to the XYZ planes when the CuKα line is used in the X-ray diffraction wide angle technique.

DESCRIPTION OF THE PREFERRED EMBODIMENTS

Preferred embodiments of the present invention will now be described with reference to the drawings.

Overall Structure of Inkjet Printer

Figure 1:
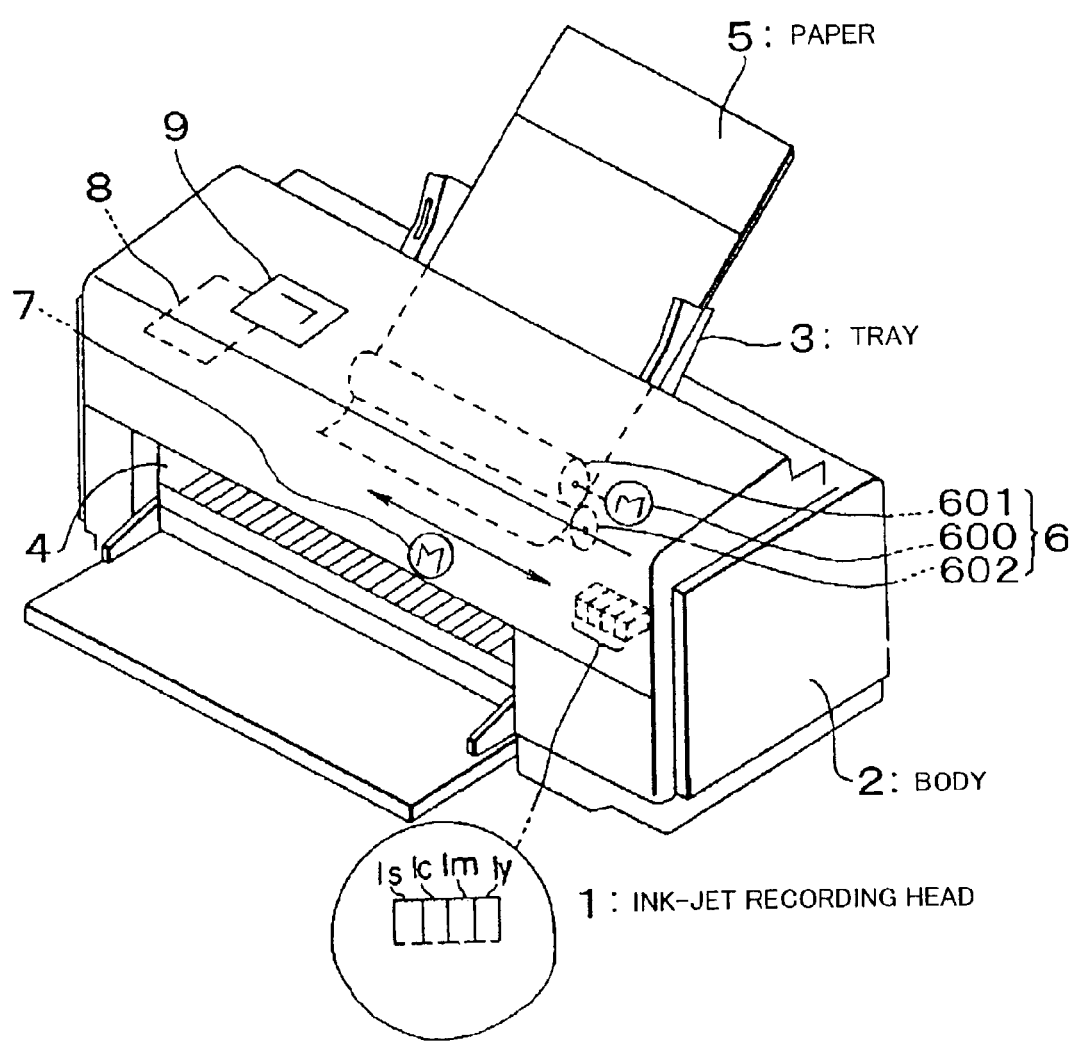
FIG. 1 is a perspective view illustrating a printer structure obtained using a piezoelectric element according to an embodiment of the present invention.

FIG. 1 is perspective view illustrating a structure of a printer as a liquid jetting apparatus featuring the piezoelectric elements of an embodiment of the present invention. The printer comprises a main body 2, that is provided with a tray 3, a release port 4, and an operating button 9. In addition, the main body 2 contains an inkjet recording head 1 as an example of the liquid jetting head of the present invention, as well as a paper feeder mechanism 6 and a control circuit 8.

The inkjet recording head 1 comprises a plurality of piezoelectric elements formed on a substrate, and is configured such that ink or another liquid can be ejected from nozzles in accordance with jetting signals supplied from the control circuit 8.

In the main body 2, which is the printer casing, the feeder mechanism 6 is disposed at a position in which paper 5 can be fed from the tray 3, and the inkjet recording head 1 is disposed such that paper 5 can be printed on. The tray 3 is configured such that clean paper 5 can be fed to the feeder mechanism 6, and the release port 4 is an outlet for discharging paper 5 after printing has been completed.

The paper feeder mechanism 6 comprises a motor 600, rollers 601 and 602, and other mechanical structures (not shown). The motor 600 can rotate in accordance with drive signals supplied from the control circuit 8. The mechanical structures are configured to allow the rotational force of the motor 600 to be transmitted to the rollers 601 and 602. The rollers 601 and 602 are adapted to rotate when the rotational force of the motor 600 is transmitted, and are adapted to pull in the paper 5 from the tray 3 by means of rotation and to allow printing to be performed by the head 1.

The control circuit 8 comprises a CPU, ROM, RAM, interface circuit, and the like (not shown) and is adapted to supply a drive signal to the feeder mechanism 6, or a jetting signal to the inkjet recording head 1 in accordance with printing information supplied from the computer via a connector (not shown). In addition, the control circuit 8 is adapted to allow operating modes to be set, resetting to be performed, and other actions to be taken in accordance with the operating signals from a control panel 9.

The printer of the present embodiment comprises the below-described inkjet recording head having consistently high piezoelectric characteristics and a good printing performance, and is therefore a high-performance printer.

Structure of Inkjet Recording Head

Figure 2:
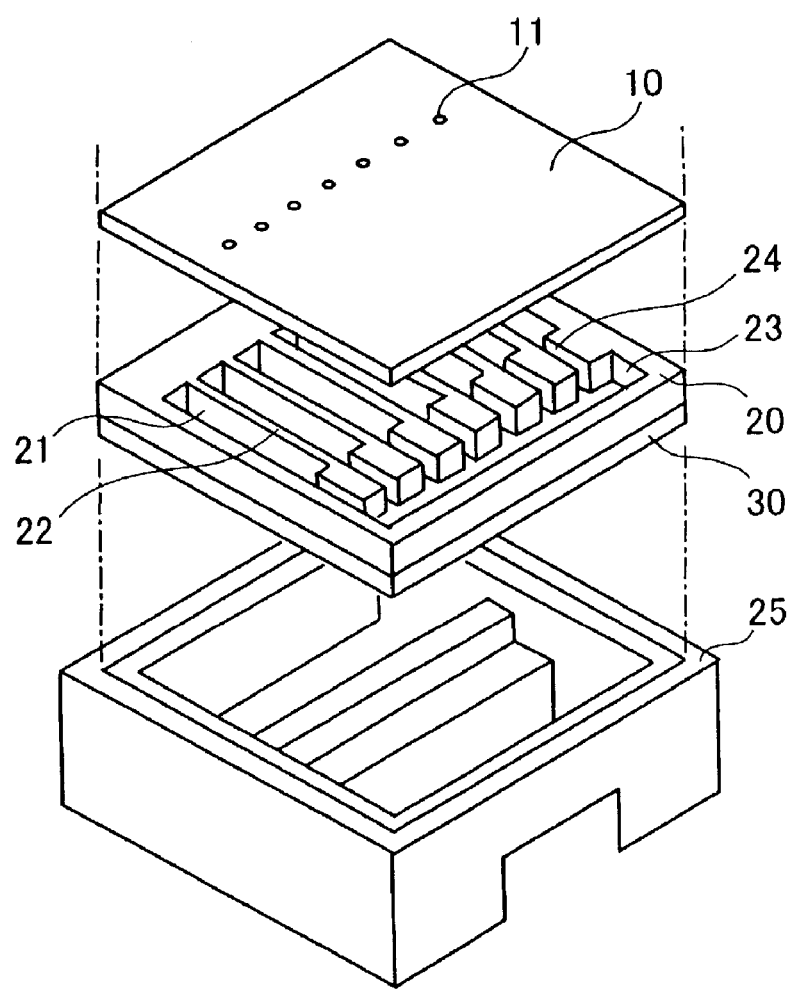
FIG. 2 is an exploded perspective view depicting structure of the principal components of an inkjet recording head according to an embodiment of the present invention.

FIG. 2 is an exploded perspective view depicting a partial structure of the inkjet recording head according to an embodiment of the present invention.

The inkjet recording head comprises a nozzle plate 10, a pressure chamber substrate 20, and a diaphragm 30, as shown in FIG. 2.

The pressure chamber substrate 20 comprises pressure chambers (cavities) 21, side walls 22, a reservoir 23, and supply openings 24. The pressure chambers 21 are formed as storage spaces for storing the ink or the like to be jetted, by the etching of silicon or another substrate. The side walls 22 are formed to partition the pressure chambers 21. The reservoir 23 serves as a common conduit for filling the pressure chambers 21 with the ink. The supply openings 24 are formed to allow the ink to be introduced from the reservoir 23 to the pressure chambers 21.

The nozzle plate 10 is formed on one side of the pressure chamber substrate 20 such that the nozzles 11 thereof are disposed at positions that correspond to the pressure chambers 21 formed in the pressure chamber substrate 20.

The diaphragm 30 is formed by layering an oxide film 31 and a $ZrO_2$ film 32 on the other side of the pressure chamber substrate 20, as described below. The diaphragm 30 is provided with an ink tank port (not shown) to allow the ink stored in the ink tank (not shown) to be fed into the reservoir 23 of the pressure chamber substrate 20.

The pressure chamber substrate 20, provided with the nozzle plate 10 and the diaphragm 30, is placed in a casing 25, completing the inkjet recording head 1.

Structure of Piezoelectric Element

Figure 3A:
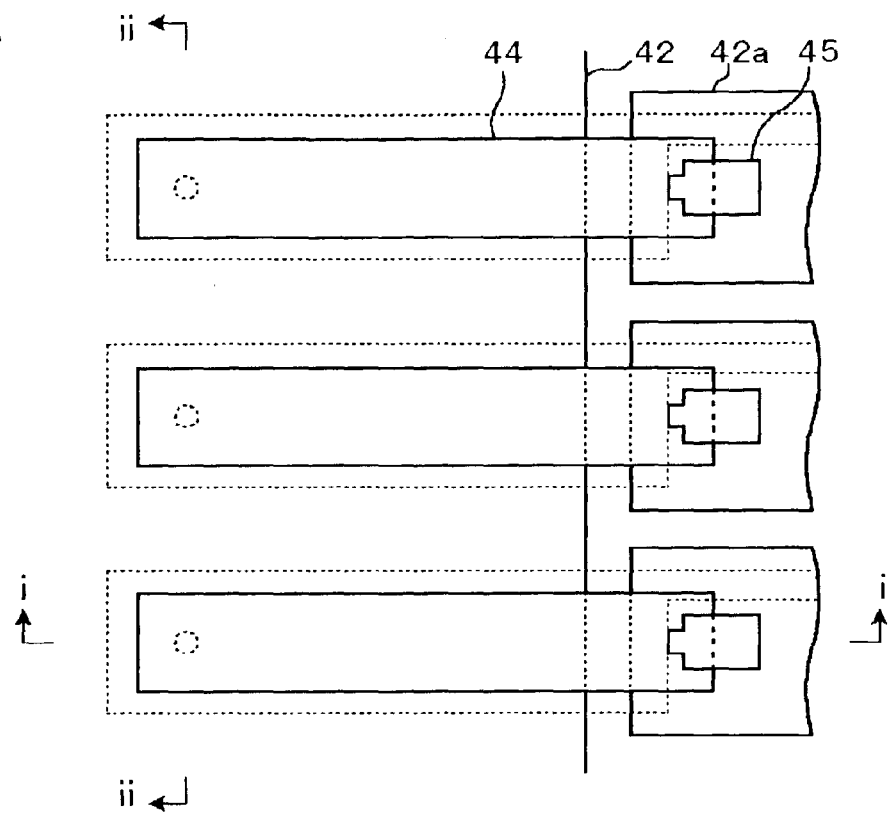
FIG. 3A is an enlarged plane view of the piezoelectric element portion of the aforementioned inkjet recording head.
Figure 3B:
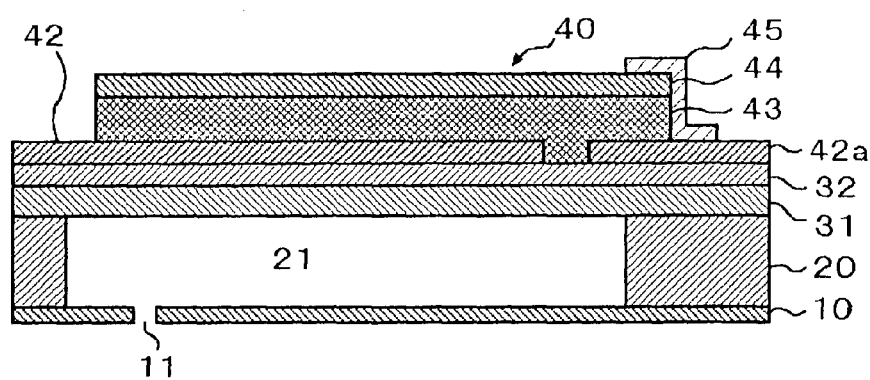
FIG. 3B is a cross-sectional view along line i—i of FIG. 3A.
Figure 3C:
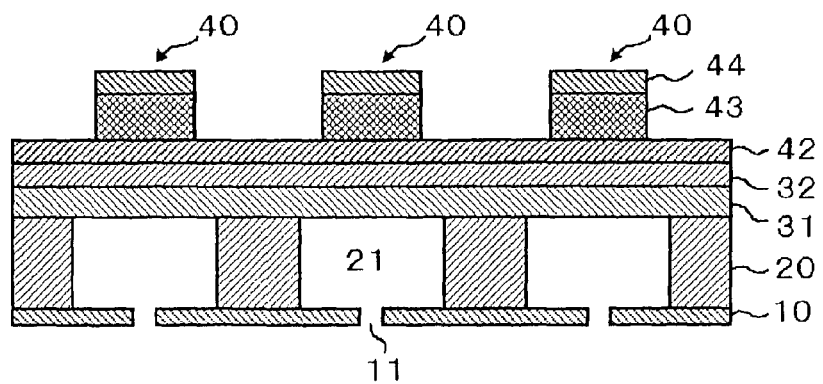
FIG. 3C is a cross-sectional view along line ii—ii of FIG. 3A.

FIG. 3A is an enlarged plane view of the piezoelectric element portion of the aforementioned inkjet recording head, FIG. 3B is a cross-sectional view along line i—i of FIG. 3A, and FIG. 3C is a cross-sectional view along line ii—ii of FIG. 3A.

Each piezoelectric element 40 is obtained by the successive layering of $ZrO_2$ film 32, a bottom electrode 42, a piezoelectric thin film 43, and a top electrode 44 on an oxide film 31, as shown in FIG. 3B.

The oxide film 31 is formed as an insulating film on the pressure chamber substrate 20, which is composed, for example, of a piece of single-crystal silicon with a thickness of 220 μm. In a preferred embodiment, a film composed of silicon oxide ($SiO_2$) can be formed in a thickness of 1.0 μm.

The $ZrO_2$ film 32, which is an elasticity-imparting layer, is integrated with the oxide film 31 to form the diaphragm 30. The $ZrO_2$ film 32 is preferably fashioned to a thickness of 200 nm to 800 nm in order to ensure elasticity-imparting functionality.

A bonding layer (not shown) composed of a metal (preferably titanium or chromium) capable of bonding the two layers may be interposed between the $ZrO_2$ film 32 and the bottom electrode 42. The bonding layer is formed in order to improve adhesion to the mounting surface of the piezoelectric element, and may be dispensed with if the desired adhesiveness can be ensured. A thickness of 10 nm or greater is preferably selected if the bonding layer is provided.

The bottom electrode 42 has a layered structure that contains at least an Ir-containing layer, an example of which is a structure having the following layer sequence, from the bottom up: Ir-containing layer/Pt-containing layer/Ir-containing layer. The total thickness of the bottom electrode 42 may, for example, be 100 nm.

The layer structure of the bottom electrode 42 is not limited to the above option and may be a two-layer structure such as Ir-containing layer/Pt-containing layer or Pt-containing layer/Ir-containing layer. It is also possible to form the structure using an Ir-containing layer alone.

The piezoelectric thin film 43 is a ferroelectric film composed of a piezoelectric ceramic crystal, preferably lead zirconate titanate (PZT) or another ferroelectric piezoelectric material, or a material obtained by adding niobium oxide, nickel oxide, magnesium oxide, or another metal oxide thereto. The composition of the piezoelectric thin film 43 is appropriately selected with consideration for the characteristics, application, and other attributes of the piezoelectric elements. Specifically, it is possible to use lead titanate ($PbTiO_3$), lead zirconate titanate ($Pb(Zr, Ti)O_3$), lead zirconate ($PbZrO_3$), lead lanthanum titanate (($Pb, La), TiO_3$), lead lanthanum zirconate titanate (($Pb, La)(Zr, Ti)O_3$), lead magnesium niobate zirconium titanate ($Pb(Zr, Ti)(Mg, Nb)O_3$), or the like. In addition, a film having excellent piezoelectric characteristics can be obtained by appropriately adding niobium (Nb) to lead titanate or lead zirconate.

The degree of orientation of the piezoelectric thin film 43 in the 100 plane is preferably 70% or greater, and particularly 80% or greater, as measured by the X-ray diffraction wide angle technique. The degree of orientation in the 110 plane is 10% or less, and the rest is the degree of orientation in the 111 plane. The sum of the degree of orientation in the 100 plane, the degree of orientation in the 110 plane, and the degree of orientation in the 111 plane is 100%.

The thickness of the piezoelectric thin film 43, which should be controlled to a degree at which cracking is prevented during manufacturing steps, and at the same time must be sufficiently large to yield adequate displacement characteristics, may, for example, be set no less than 1000 nm and no more than 1500 nm.

The top electrode 44, which is an electrode that constitutes a pair with the bottom electrode 42, is preferably composed of Pt or Ir. The thickness of the top electrode 44 is preferably about 50 nm.

The bottom electrode 42 serves as a common electrode for the piezoelectric elements. By contrast, a wiring bottom electrode 42a is disposed in a layer of the same height as the bottom electrode 42, but is separated from the bottom electrode 42 and other wiring bottom electrodes 42a, and provides a conduction path to the top electrode 44 via a band electrode 45.

Operation of Inkjet Recording Head

Following is a description of the printing operation performed by the inkjet recording head 1 thus configured. When a drive signal is output by the control circuit 8, the feeder mechanism 6 is actuated and paper 5 is transported to the position at which printing can be performed by the head 1. No deformation is induced in the piezoelectric film 43 if no jetting signal is supplied from the control circuit 8 and if no voltage is applied between the bottom electrode 42 and top electrode 44 of a piezoelectric element. No pressure variations occur in the cavity 21 whose piezoelectric element does not receive any jetting signal, and no ink drops are jetted from the corresponding nozzle 11.

By contrast, deformation is induced in the piezoelectric film 43 when a jetting signal is supplied from the control circuit 8, and a voltage is applied between the bottom electrode 42 and the top electrode 44 of the piezoelectric element. The diaphragm 30 adjacent to the cavity 21 corresponding to a piezoelectric element that received the jetting signal is strongly bent. For this reason, the pressure inside the cavity 21 momentarily increases, and an ink drop is ejected from the nozzle 11. Arbitrary characters or figures can be printed by the individual supply of jetting signals to the piezoelectric elements disposed at the positions in the head at which printing needs to be performed.

Manufacturing Method

Figure 4:
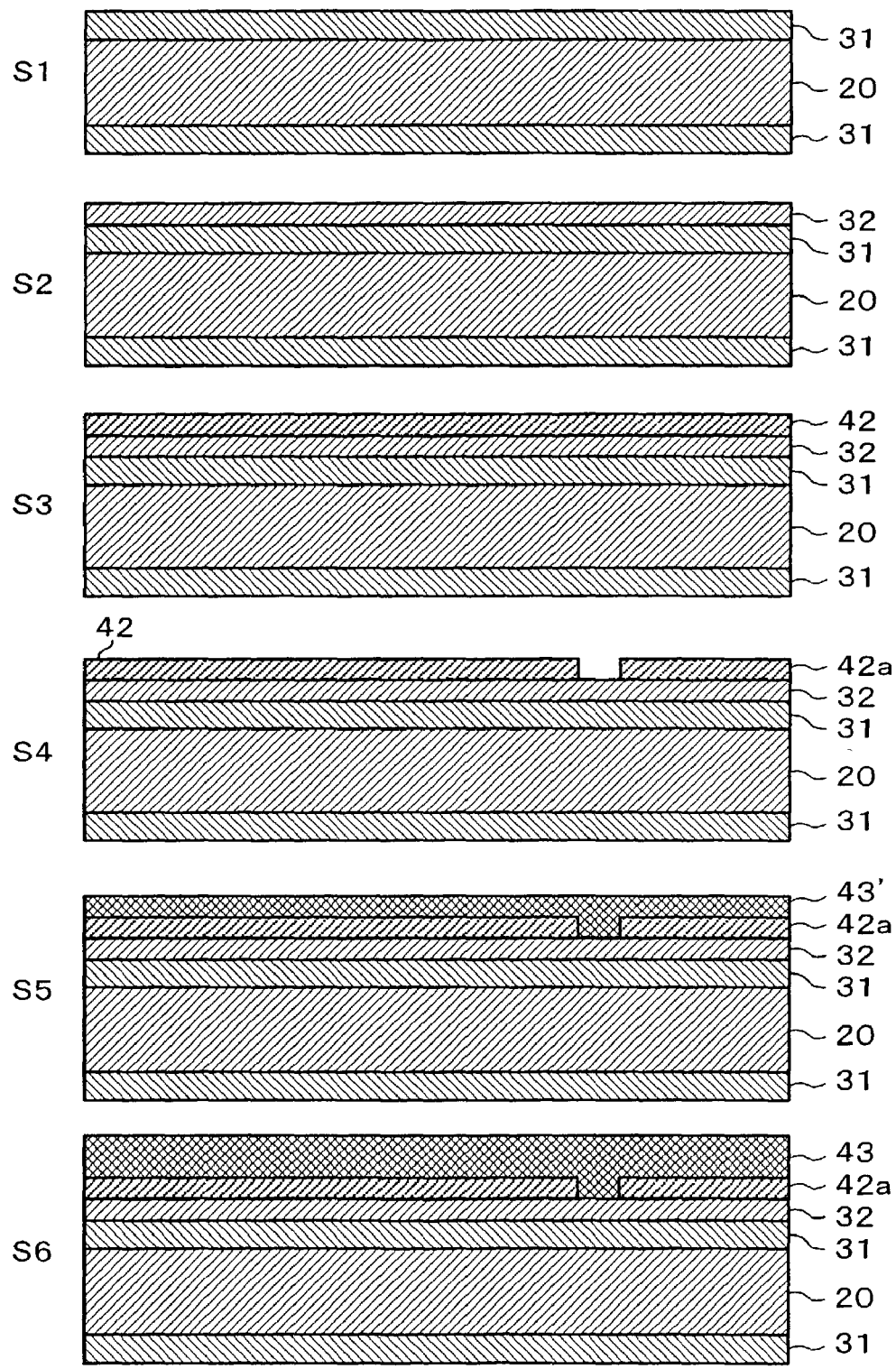
FIG. 4 is a cross-sectional schematic view depicting the method for manufacturing an inkjet recording head in accordance with an embodiment of the present invention.
Figure 5:
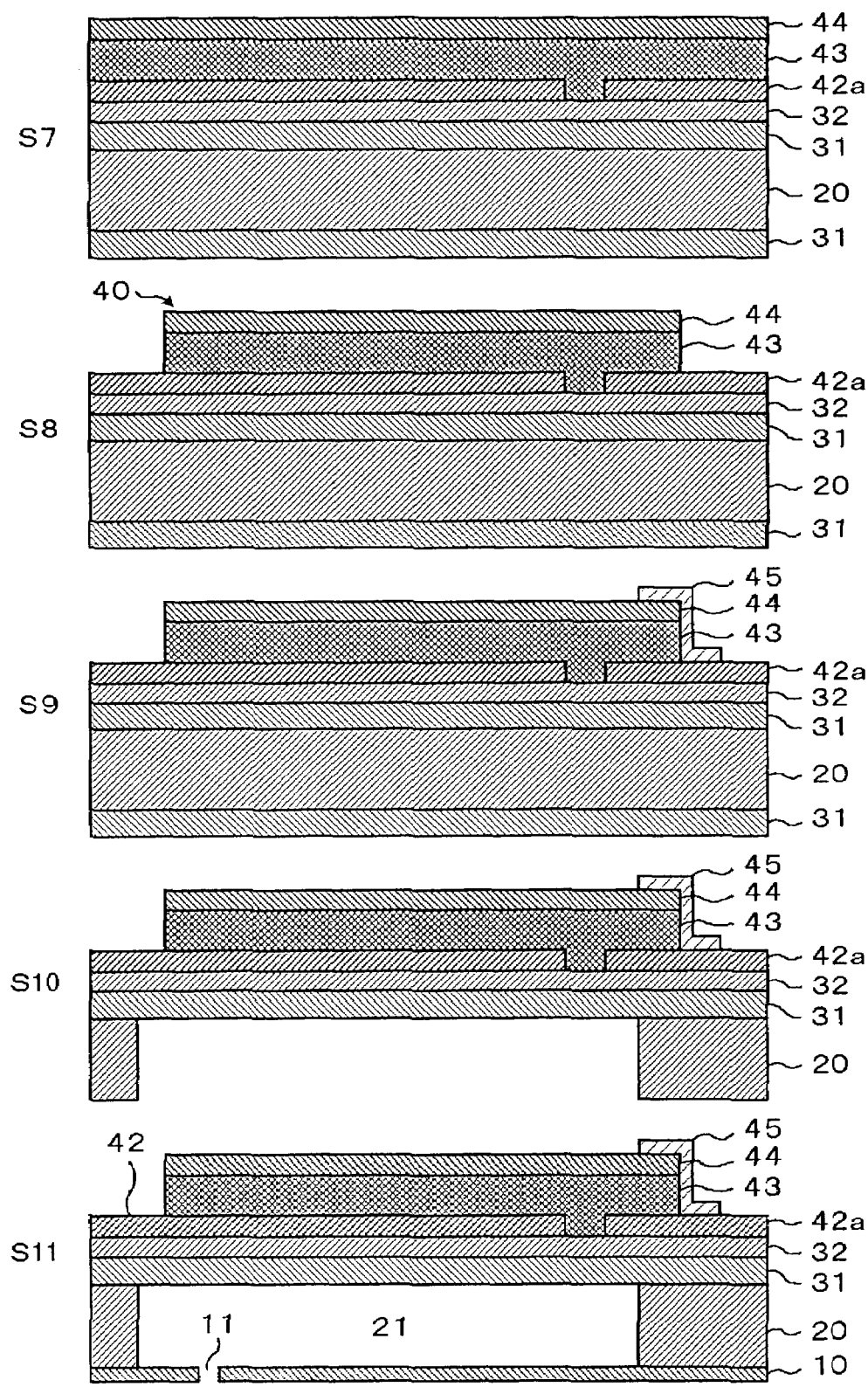
FIG. 5 is a cross-sectional schematic view depicting the method for manufacturing an inkjet recording head in accordance with an embodiment of the present invention.

A method for manufacturing a piezoelectric element in accordance with the present invention will now be described. FIGS. 4 and 5 are cross-sectional schematic views depicting the method for manufacturing a piezoelectric element and an inkjet recording head in accordance with an embodiment of the present invention.

The step (S5) for forming the below-described piezoelectric precursor film, which entails formation of a piezoelectric thin film, and the annealing step (S6) are performed in an environment with a humidity of 30% Rh or less.

Oxide Film Formation Step (S1)

It is a step in which a silicon substrate 20 is heat-treated in an oxidizing atmosphere containing oxygen or water vapor to form an oxide film 31 composed of silicon oxide ($SiO_2$). In this step, CVD may also be used in stead of the commonly used thermal oxidation.

Step for Forming $ZrO_2$ Film (S2)

It is a step in which a $ZrO_2$ film 32 is formed on the oxide film 31, which is itself formed on one side of the pressure chamber substrate 20. The $ZrO_2$ film 32 is obtained by a process forming a Zr layer by sputtering or vacuum vapor deposition and heat-treating the Zr layer in all oxygen atmosphere.

Step for Forming Bottom Electrode (S3)

A bottom electrode 42 is formed on the $ZrO_2$ film 32. For example, an Ir-containing layer is first formed, a Pt-containing layer is subsequently formed, and an Ir-containing layer is then formed.

The layers constituting the bottom electrode 42 are formed by individually depositing Ir or Pt on the $ZrO_2$ film 32 by sputtering or the like. A bonding layer (not shown) composed of titanium or chromium may be formed by sputtering or vacuum vapor deposition before the bottom electrode 42 is formed.

It is also possible to set the thickness of the Pt-containing layer in the bottom electrode to a specific proportion in relation to the thickness of the entire bottom electrode in order to control the orientation of the piezoelectric thin film 43. In the present embodiment, however, no particular restrictions are imposed on the ratio of the thickness of the Pt-containing layer to the thickness of the entire bottom electrode, so the thickness of the entire bottom electrode 42 can be reduced and the strain of the piezoelectric thin film 43 can be efficiently transmitted to the pressure chambers 21.

Patterning Step Following the Formation of Bottom Electrode (S4)

To separate the bottom electrode thus formed from the wiring bottom electrode 42a, patterning is first performed by masking the bottom electrode 42 in the desired configuration and etching the adjacent areas. Specifically, a resist material having a uniform thickness is applied to the bottom electrode by spinning, spraying, or the like (not shown); a mask is formed in the shape of piezoelectric elements; exposure and development are then performed to form a resist pattern on the bottom electrode (not shown). The bottom electrode is etched away by ion milling, dry etching, or another technique commonly used, and the $ZrO_2$ film 32 is exposed.

Cleaning (not shown) is subsequently performed by reverse sputtering in order to remove the contaminants, oxidized portions, and other species deposited on the surface of the bottom electrode during the patterning step.

Step for Forming Ti Nucleus (Layer)

It is a step in which a Ti nucleus (layer) (not shown) is formed on the bottom electrode 42 by sputtering or the like. The reason why a Ti nucleus (layer) is formed is that growing PZT by using a Ti crystal as the nucleus causes crystal growth to proceed from the side facing the bottom electrode and yields dense columnar crystals.

In addition, the mean thickness of the Ti nucleus (layer) is 3–7 nm, and preferably 4–6 nm.

Step for Forming Piezoelectric Precursor Film (S5)

It is a step in which a piezoelectric precursor film 43' is formed by the sol-gel technique.

A sol comprising an organic metal alkoxide solution is first applied to the Ti nucleus layer by spin coating or another application technique. The product is subsequently dried at a given temperature for a given time, and the solvent is vaporized. After the product is dried, the product is degreased at a specific temperature for a given time in the atmospheric environment to cause the organic ligands coordinated to the metal to pyrolyze and to form a metal oxide.

The steps involving application, drying, and degreasing are repeated for example, twice), and a piezoelectric precursor film consisting of two layers is layered. The metal alkoxide and acetate in the solution are formed into a metal/oxygen/metal network via ligand pyrolysis by such drying and degreasing treatments.

Annealing Step (S6)

It is a step in which the piezoelectric precursor film 43' is annealed after being formed, and crystallized to form a piezoelectric thin film. As a result of this annealing, the piezoelectric precursor film 43' assumes a rhombohedral crystal structure from an amorphous state, converts to a thin film that exhibits an electromechanical conversion action, and becomes a piezoelectric thin film 43 whose degree of orientation in the 100 plane is 80%, as measured by the X-ray diffraction wide angle technique.

The piezoelectric thin film can be fashioned in the desired thickness by repeating the formation (S5) and annealing (S6) of such a precursor film a plurality of times. For example, the thickness of the precursor film applied per annealing cycle may be set to 200 nm, and the operations repeated five times. The crystal growth in the layers formed by the second and subsequent annealing cycles is affected by the sequential underlying piezoelectric film layers, and the degree of orientation in the 100 plane reaches 80% throughout the entire piezoelectric thin film.

Top Electrode Formation Step (S7)

The top electrode 44 is formed by electron beam vapor deposition or sputtering on the piezoelectric thin film 43.

Piezoelectric Thin Film and Top Electrode Removal Step (S8)

It is a step in which the piezoelectric thin film 43 and top electrode 44 are patterned in the specific shape of piezoelectric elements. Specifically, a resist is applied by spin coating to the top electrode 44, a match is established with the positions in which pressure chambers are to be formed, exposure and development are conducted, and patterning is carried out. The top electrode 44 and the piezoelectric thin film 43 are etched by ion milling or the like, with the remaining resist being used as a mask. Piezoelectric elements 40 are formed in the above steps.

Band Electrode Formation Step (S9)

A band electrode 45 for providing a connection path to the top electrode 44 and the wiring bottom electrode 42a is subsequently formed. The material of the band electrode 45 is preferably a metal with low rigidity and low electric resistance. Aluminum, copper, or the like is preferably used. The band electrode 45 is formed in a thickness of about 0.2 μm, and patterning is then carried out to leave behind portions that provide conduction paths to the top electrode and the wiring bottom electrode used for connection purposes.

Pressure Chamber Formation Step (S10)

The side of the pressure chamber substrate 20 opposite from the one on which the piezoelectric elements 40 have been formed is subsequently subjected to anisotropic etching, parallel-plate reactive ion etching, or another type of anisotropic etching using an inert gas, and pressure chambers 21 are formed. The remaining unetched portions serve as side walls 22.

Step for Laminating Nozzle Plate (S11)

A nozzle plate 10 is finally laminated to the etched pressure chamber substrate 20 with the aid of an adhesive. The parts being laminated are aligned such that the nozzles 11 are disposed in the spaces of the pressure chambers 21. The pressure chamber substrate 20 with the laminated nozzle plate 10 is mounted in a casing (not shown), completing the inkjet recording head 1.

EXAMPLE

Figure 6:
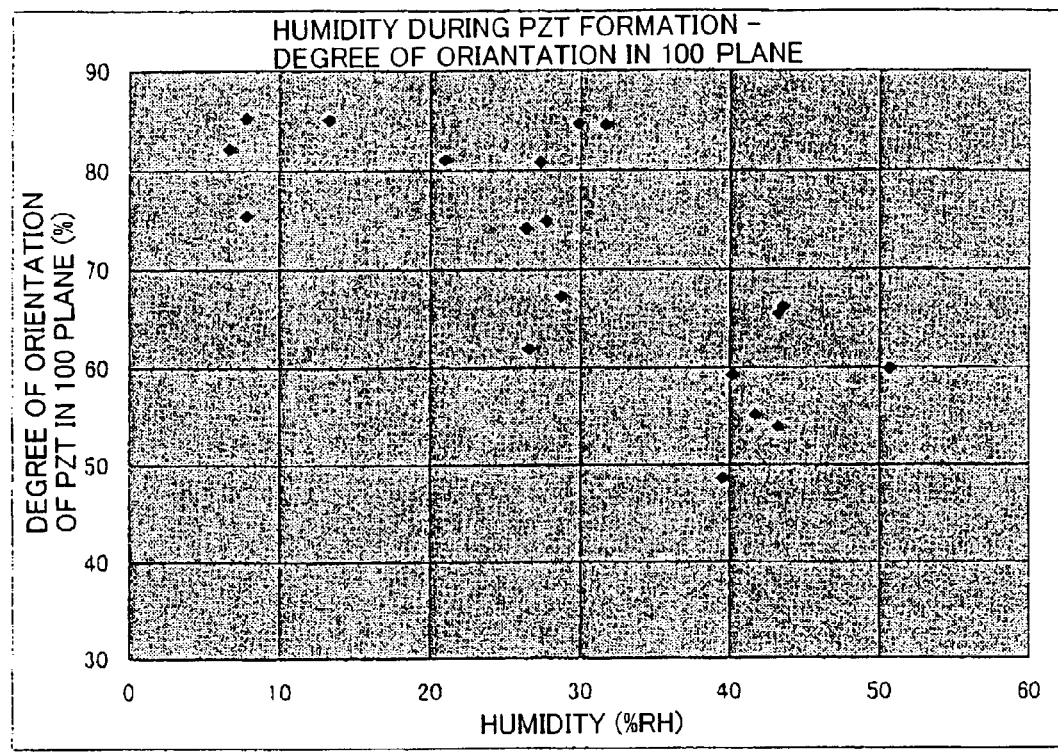
FIG. 6 shows the relation between the ambient humidity and the degree of orientation in the 100 plane.

FIG. 6 shows the results of measuring the relation between the degree of orientation of a piezoelectric thin film in the 100 plane and the humidity maintained during the formation of a film in a piezoelectric element obtained by forming a patterned bottom electrode on a $ZrO_2$ film, forming a Ti nucleus, and forming a PZT piezoelectric thin film.

The degree of orientation of the piezoelectric thin film tends to decrease as the humidity increases, and a film whose degree of orientation in the 100 plane is 70% or greater can be obtained in a stable manner at a humidity of 30% Rh or less. The humidity range is set to 30% Rh or less in order to avoid situations in which the piezoelectric precursor film 43' tends to absorb moisture and the growth of crystals in the 100 plane during annealing is impeded if the humidity exceeds 30% Rh.

Figure 7:
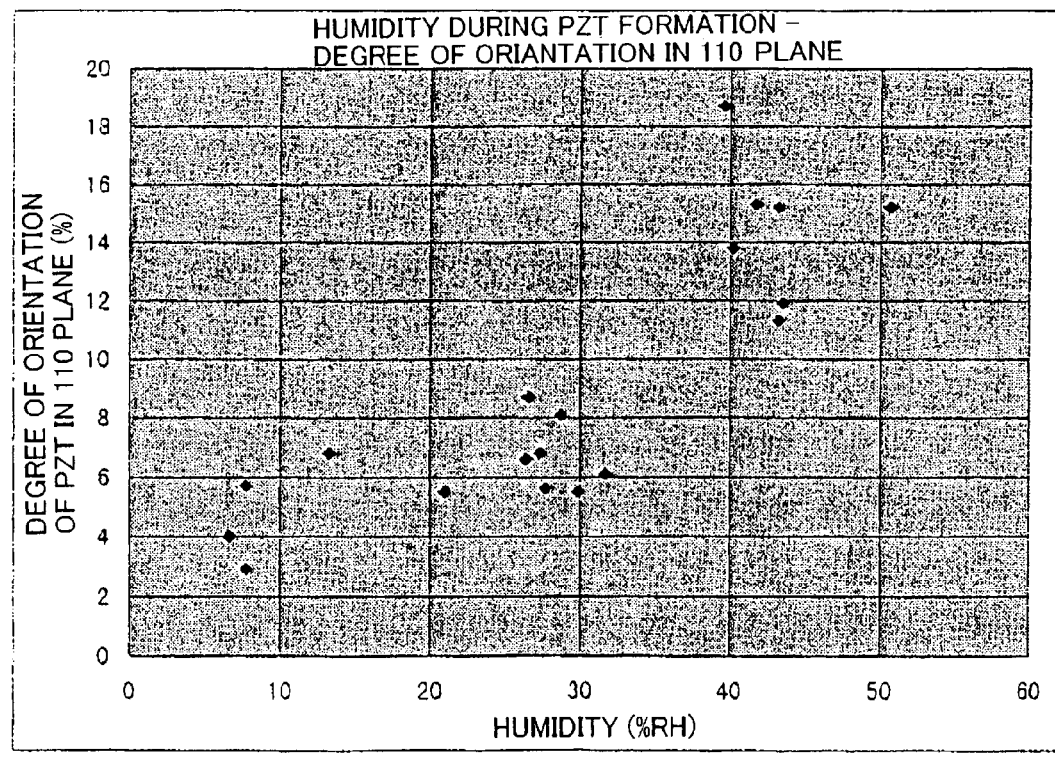
FIG. 7 shows the relation between the ambient humidity and the degree of orientation in the 110 plane.

FIG. 7 shows the relation between the humidity during film formation and the degree of orientation of a piezoelectric thin film in the 110 plane. The degree of orientation in the 110 plane tends to increase as the humidity increases, and the degree of orientation in the 110 plane is equal to 10% or less at a humidity of 30% Rh or less.

The degree of orientation of the PZT film in the 111 plane is given by the balance of the degrees of orientation in the 100 and 110 planes.

Figure 8:
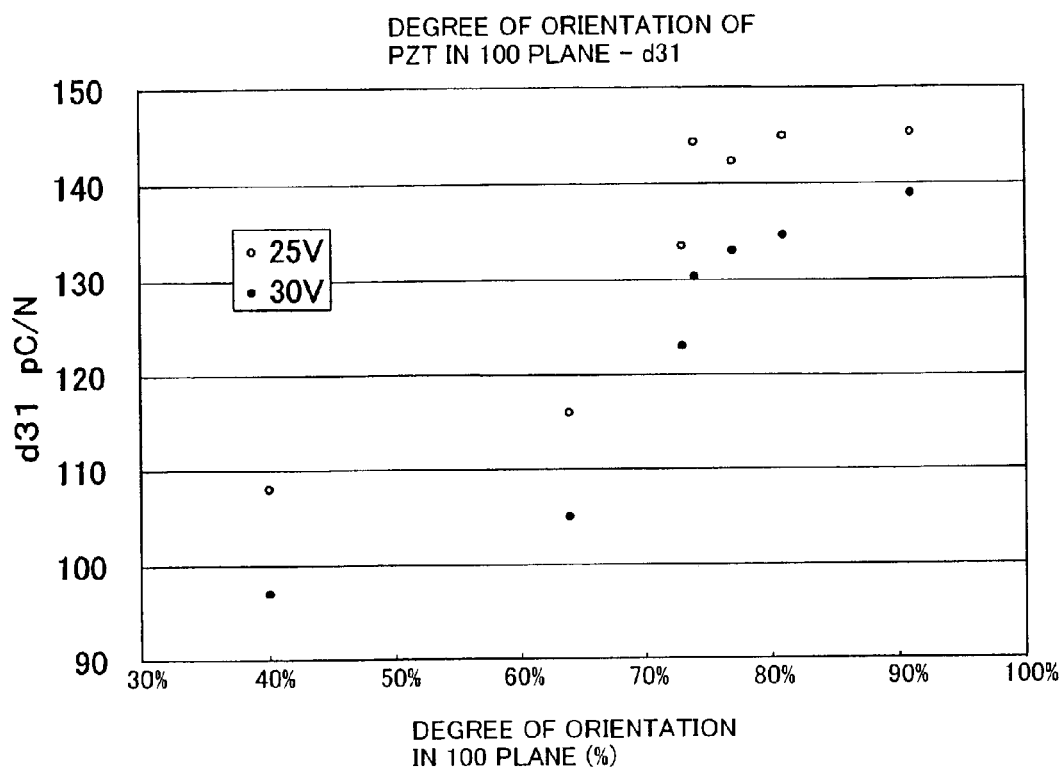
FIG. 8 shows the relation between the piezoelectric $d_{31}$ constant and the degree of orientation in the 100 plane.

FIG. 8 shows the relation between the piezoelectric $d_{31}$ constant and the degree of orientation in the 100 plane. Specifically, this relation is obtained by preparing PZT films that have a thickness of 1.5 μm and various degrees of orientation in the 100 plane, applying 100 million rectangular-wave voltage pulses thereto, and measuring the piezoelectric $d_{31}$ constant at voltages of 25 V and 30 V.

The measurements results indicate that a high piezoelectric constant can be obtained when the degree of orientation in the 100 plane is 70% or greater, both at 25 V and at 30 V. Even when the degree of orientation in the 100 plane is 70% or greater, a higher piezoelectric constant is exhibited at a higher degree of orientation in the 100 plane, particularly at 30 V, which is a voltage that exerts a strong electric field on the piezoelectric element film. With an increase in the density of liquid jetting heads, stronger electric fields are exerted on the piezoelectric element films for drive purposes as the piezoelectric element films become thinner, and setting the degree of orientation in the 100 plane to 80% or greater is more preferable if application of such strong electric fields is envisaged.

The reason why the above measurements are performed after 100 million voltage pulses have been applied is to reduce the stress developed during the formation of pressure chambers 21 by etching, and to stabilize the polarization of the PZT films.

Manufacturing Apparatus

Figure 9:
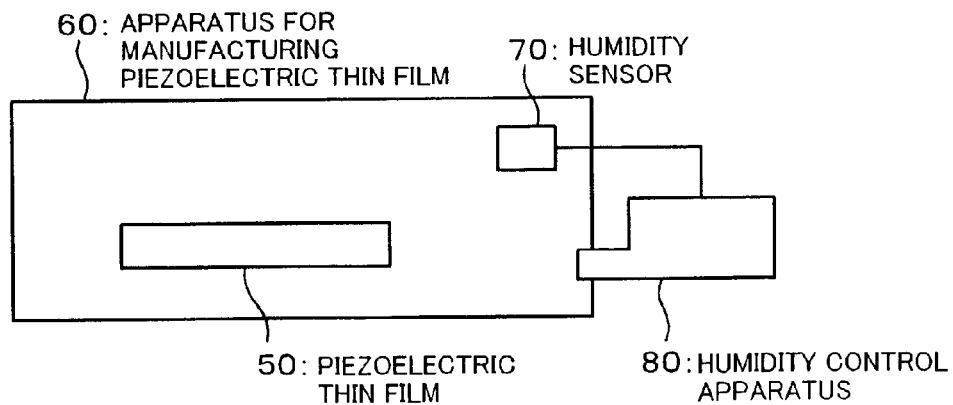
FIG. 9 is a schematic diagram of the piezoelectric element manufacturing system.

FIG. 9 shows a piezoelectric element manufacturing system of the present invention. The piezoelectric element manufacturing system comprises a piezoelectric element manufacturing apparatus 60, humidity sensor 70, and humidity-adjusting apparatus 80.

The apparatus 60 for manufacturing a piezoelectric thin film is configured to perform the step for forming a piezoelectric thin film 50 on the bottom electrode. The humidity sensor 70 is mounted inside the apparatus 60 for manufacturing a piezoelectric thin film, and the ambient humidity for forming piezoelectric thin films is sensed by the humidity sensor 70. The humidity sensor 70 sends the detection signal to the humidity-adjusting apparatus 80, and the humidity-adjusting apparatus 80 controls the ambient humidity for forming piezoelectric thin films based on the received signal.

The environment for forming piezoelectric thin films can thus be adjusted to a humidity of 30% Rh or less.

Other Application Examples

The present invention is not limited to the above-described embodiments and can be modified and applied in a variety of ways. For example, a piezoelectric element manufactured in accordance with the present invention can be applied not only to the manufacture of piezoelectric elements for the above-described inkjet recording head, but also to the manufacture of ferroelectric devices, dielectric devices, pyroelectric devices, piezoelectric devices, and electro-optic devices such as nonvolatile semiconductor memory devices, thin-film capacitors, pyroelectric detectors, sensors, surface-acoustic-wave optical waveguides, optical memory devices, spatial light modulators, and frequency doublers for diode lasers.

Furthermore, the liquid jetting head of the present invention can be applied to the following devices in addition to the ink-jetting heads used in inkjet recording devices: heads for ejecting liquids that contain colorants used in the manufacture of color filters for liquid-crystal displays and the like; heads for ejecting liquids that contain electrode materials used in the formation of organic EL displays, FEDs (field emission displays), and the like; heads for ejecting liquids that contain bioorganic matter used in biochip production; and heads for spraying various other liquids.

According to the present invention, the degree of orientation of a piezoelectric thin film in the 100 plane can be stabilized and obtained with good reproducibility. Consequently, the desired ratio of the degree of orientation in the 100 plane and the degree of orientation in the 111 plane can be maintained with good reproducibility in a piezoelectric thin film. It is thus possible to provide a piezoelectric element that has consistently high piezoelectric characteristics both at high frequencies and at low frequencies, to provide a liquid jetting head featuring this, and to provide a method for manufacturing such piezoelectric elements.

What is claimed is:

1. A method for manufacturing a piezoelectric element, comprising the steps of:
    forming a bottom electrode having at least an Ir layer on a $ZrO_2$ film;
    forming a Ti nucleus on the bottom electrode;
    forming a piezoelectric precursor film in an environment with a humidity of 30% RH or less;
    annealing the piezoelectric precursor film to form a piezoelectric thin film in an environment with a humidity of 30% Rh or less; and
    forming a top electrode on the piezoelectric thin film.

2. The method for manufacturing a piezoelectric element according to claim 1, wherein the Ti nucleus is formed in a thickness of 3 nm to 7 nm.

3. The method for manufacturing piezoelectric element according to claim 2, wherein the piezoelectric thin film is formed by a sol-gel technique.

4. The method for manufacturing a piezoelectric element according to claim 1, wherein the piezoelectric thin film is formed by a sol-gel technique.

5. A method for manufacturing a liquid jetting head comprising the steps of:
    providing piezoelectric elements manufactured by forming a bottom electrode having at least an Ir layer on a $ZrO_2$ film, forming a Ti nucleus on the bottom electrode, forming a piezoelectric precursor film in an environment with a humidity of 30% RH or less, annealing the piezoelectric precursor film to form a piezoelectric thin film in an environment with a humidity of 30% Rh or less, and forming a top electrode on the piezoelectric thin film;
    forming a diaphragm on one surface of a substrate;
    forming the piezoelectric elements on the diaphragm; and
    etching the substrate to form pressure chambers.

6. The method for manufacturing a liquid jetting heading according to claim 5, wherein the piezoelectric thin films are formed by a sol-gel technique.

7. The method for manufacturing a liquid jetting head according to claim 5, wherein the Ti nucleus is formed in a thickness of 3 nm to 7 nm.

8. The method for manufacturing a liquid jetting head according to claim 7, wherein the piezoelectric thin films are formed by a sol-gel technique.

* * * * *